United States Patent
Hsu et al.

(10) Patent No.: US 7,778,351 B2
(45) Date of Patent: Aug. 17, 2010

(54) TUNABLE CMOS RECEIVER APPARATUS

(75) Inventors: Louis L. Hsu, Fish Kill, NY (US);
Li-Kong Wang, Montvale, NJ (US);
Philip J. Murfet, Stockbridge (GB)

(73) Assignee: International Business Machines Corporation, Armonk, NY (US)

( * ) Notice: Subject to any disclaimer, the term of this patent is extended or adjusted under 35 U.S.C. 154(b) by 2507 days.

(21) Appl. No.: 10/118,750

(22) Filed: Apr. 9, 2002

(65) Prior Publication Data

US 2003/0189990 A1 Oct. 9, 2003

(51) Int. Cl.
*H03F 3/26* (2006.01)
*H03F 3/68* (2006.01)
*H03F 3/04* (2006.01)
*H04L 25/03* (2006.01)

(52) U.S. Cl. .................. 375/297; 375/316; 375/295; 375/318; 330/266; 330/272; 330/289

(58) Field of Classification Search .............. 359/189; 330/254, 293, 2, 7, 256, 257, 266, 272, 278, 330/289, 290, 291, 54, 133; 455/245.2, 232.1, 455/234.1, 234.2, 235.1, 239.1, 245.1, 247.1, 455/250.1; 375/316, 340, 345, 240, 344, 375/371, 375, 376, 297, 317, 318, 319, 295; 329/350–353; 370/250.1, 251.1, 252.1, 253.1, 370/266, 261, 257, 256, 254, 283, 287; 327/179, 327/180, 192, 206, 207, 208, 306, 308, 309, 327/310, 315
See application file for complete search history.

(56) References Cited

U.S. PATENT DOCUMENTS

| | | | | |
|---|---|---|---|---|
| 4,492,930 | A * | 1/1985 | Knowles et al. | 330/284 |
| 5,181,138 | A * | 1/1993 | Davis et al. | 359/239 |
| 5,341,405 | A * | 8/1994 | Mallard, Jr. | 375/376 |
| 5,805,236 | A * | 9/1998 | Roth | 348/571 |
| 5,852,637 | A | 12/1998 | Brown et al. | |
| 5,864,416 | A * | 1/1999 | Williams | 398/202 |
| 6,122,336 | A * | 9/2000 | Anderson | 375/371 |
| 6,606,364 | B1 * | 8/2003 | Walley et al. | 375/376 |
| 6,683,920 | B1 * | 1/2004 | Coy | 375/326 |

(Continued)

OTHER PUBLICATIONS

Best, Ronald, "2nd Edition Phase-Locked-Loops, Theory, Design and Applications", McGraw-Hill, Inc., pp. 93-94.*

(Continued)

*Primary Examiner*—David C Payne
*Assistant Examiner*—Linda Wong
(74) *Attorney, Agent, or Firm*—Brian P. Verminski

(57) ABSTRACT

A CMOS receiver system having a tunable receiver having a tunable gain and a bandwidth system is provided. The tunable receiver includes means for receiving input signals; and a control circuit controlled by a control signal for tuning at least one of the gain and the bandwidth of the tunable receiver, wherein the control signal is indicative of a data rate of the input signals. Furthermore, a method is provided for tuning a CMOS receiver receiving input signals. The method includes the steps of receiving at least one control signal, and controlling one of gain and bandwidth of the CMOS receiver in accordance with the at least one control signal, wherein the at least one control signal is indicative of a data rate of the received input signals.

25 Claims, 6 Drawing Sheets

U.S. PATENT DOCUMENTS

| | | | |
|---|---|---|---|
| 6,928,249 B2* | 8/2005 | Robinson | 398/202 |
| 6,982,758 B2* | 1/2006 | Rossi | 348/300 |
| 7,072,590 B2* | 7/2006 | Robinson et al. | 398/202 |
| 7,181,146 B1* | 2/2007 | Yorks | 398/195 |
| 7,215,883 B1* | 5/2007 | Lewis | 398/25 |
| 7,483,499 B2* | 1/2009 | Schrodinger | 375/345 |
| 2002/0105451 A1* | 8/2002 | Gulati et al. | 341/144 |
| 2002/0129379 A1* | 9/2002 | Levinson et al. | 725/129 |
| 2002/0135845 A1* | 9/2002 | Robinson et al. | 359/189 |
| 2002/0136343 A1* | 9/2002 | Cranford et al. | 375/376 |
| 2003/0020640 A1* | 1/2003 | Perrott | 341/61 |

OTHER PUBLICATIONS

"Analysis and Design of Analog Integrated Circuits" Second Edition, Paul R. Gray, Robert G. Meyer, University of California, Berkeley, pp. 730-732.

* cited by examiner

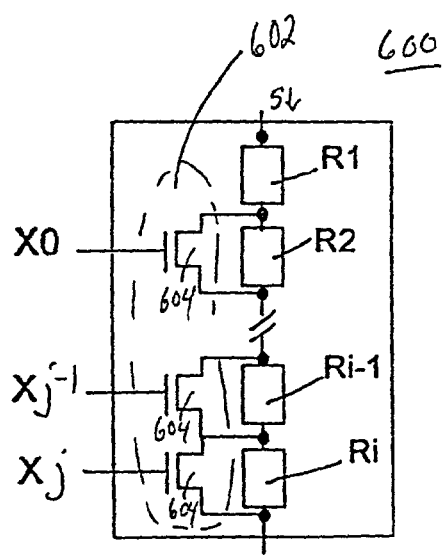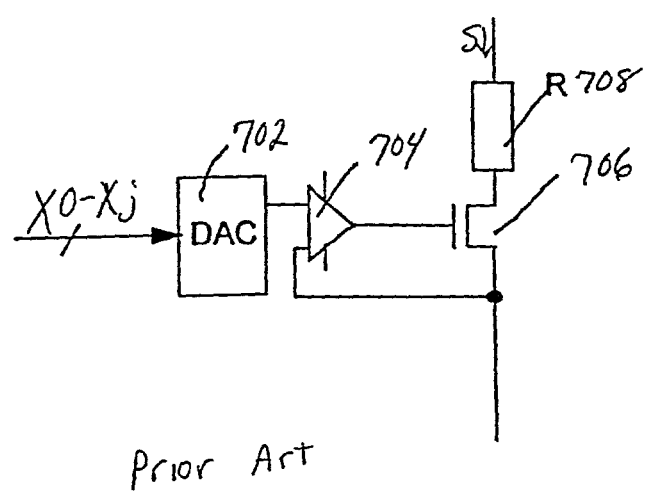
FIG. 6
Prior Art
FIG. 7

TUNABLE CMOS RECEIVER APPARATUS

FIELD OF THE INVENTION

This invention relates to the field of integrated circuits. Specifically, it relates to adjustment of gain and bandwidth of a CMOS receiver apparatus.

BACKGROUND OF THE INVENTION

Objectives in CMOS receiver design include optimization of receiver performance, such as gain, bandwidth and noise margin within the receiver; power consumption reduction; and receiver versatility for use in different applications. With regards to performance optimization, gain and bandwidth values are generally interdependent, where optimization of gain compromises bandwidth, and vice versa. For given operating conditions, such as temperature and power supply level, the gain and bandwidth product is typically constant. With regards to power consumption, power reduction may negatively affect performance.

With regards to receiver versatility, a receiver having one design may be used with different applications that may have different specifications, such as frequency and amplitude, for expected incoming signals. While design costs are reduced, and only a single set of design library files and photo-masks need be generated and maintained, performance and power consumption may be compromised. For example, one receiver may need to be capable of operating with incoming signals that have a large range of frequency.

In order for the receiver to operate with a high frequency incoming signal its bandwidth must be boosted. However when using the same receiver for an application in which the incoming signal has a lower frequency, the receiver will typically consume more power than necessary, the gain of the receiver may not be optimized, and the jitter noise margin may not be optimized either. Furthermore, for applications in which the amplitude of the incoming signal is low, optimization of gain is critical, even for applications in which the incoming signal has a low frequency.

A tunable receiver may be used to overcome the above problems, where the receiver is tuned in accordance with the operating conditions for optimizing the receiver's performance and minimizing power consumption. One suggested receiver is described in U.S. Pat. No. 5,864,416, by Williams, entitled "TUNING OPTICAL COMMUNICATIONS RECEIVER BY CONTROLLING DRAIN CURRENT INPUT TO VARIABLE TRANSCONDUCTANCE FET STAGE OF VARIABLE BANDWIDTH TRANSIMPEDANCE AMPLIFIER". However, the described receiver is designed using BiCMOS technology for receiving optical single-ended incoming signals. The bandwidth of the receiver is adjusted by using a variable transconductance device by continuously monitoring the incoming pulse frequency. A heterojunction field effect transistor HJFET is used, whose transconductance exhibits a non-linear relationship with drain current over the operational bandwidth. This method is not applicable for low-power CMOS integration. Furthermore, size and power consumption of BiCMOS circuits are relatively high compared to CMOS circuits.

Another tunable receiver is described in U.S. Pat. No. 5,852,637 by Brown et al., entitled "SERIAL MULTI-GB/S DATA RECEIVER". However, the described receiver is also designed using BiCMOS technology. The circuit is complex, since for each receiver an extra monitoring receiver and associated bias generator, and a pulse height detector circuits are needed. Thus, the size and power consumption are relatively large compared to a receiver having CMOS circuits.

Accordingly, a need exists for a relatively small and low power tunable receiver in which the gain and bandwidth of the receiver are selectable.

Furthermore, a need exists for a system and method to tune a CMOS receiver by tuning the gain via variable load resistors of stages of the receiver.

A need further exists for a system and method to tune a CMOS receiver by tuning the gain via an adjustable bias current generator.

In addition, a need exists for a system and method to tune a CMOS receiver by selecting the gain and bandwidth of the receiver during a power-on period.

Finally, a need exists for a system and method to tune a CMOS receiver by selecting the gain and bandwidth of the receiver during a operation of the receiver via a feedback control circuit in response to sensed temperature, supply voltage and incoming data rate.

SUMMARY

An aspect of the present invention is to provide a relatively small and low power tunable receiver in which the gain and bandwidth of the receiver are selectable.

Another aspect of the present invention is to provide a system and method to tune a CMOS receiver by tuning the gain via variable load resistors of stages of the receiver.

A further aspect of the present invention is to provide a system and method to tune a CMOS receiver by tuning the gain via an adjustable bias current generator.

An additional aspect of the present invention is to tune a CMOS receiver by selecting the gain and bandwidth of the receiver during a power-on period.

Finally, an aspect of the present invention is to tune a CMOS receiver by selecting the gain and bandwidth of the receiver during a operation of the receiver via a feedback control circuit in response to sensed temperature, supply voltage and incoming data rate.

Accordingly, a CMOS receiver system having tunable receiver having a tunable gain and a bandwidth is provided, the tunable receiver including means for receiving input signals, and a control circuit controlled by a control signal for tuning at least one of the gain and the bandwidth of the tunable receiver, wherein the control signal is indicative of a data rate of the input signals. Furthermore, a method for tuning a CMOS receiver receiving input signals is provided. The method includes the steps of receiving at least one control signal, and controlling one of gain and bandwidth of the CMOS receiver in accordance with the at least one control signal, wherein the at least one control signal is indicative of a data rate of the received input signals.

BRIEF DESCRIPTION OF THE DRAWINGS

FIG. 6 is a circuit diagram of one embodiment of a resistance control circuit of a tunable CMOS receiver in accordance with the present invention;

FIG. 7 is a circuit diagram of another embodiment of a resistance control circuit of a tunable CMOS receiver in accordance with the prior art;

DETAILED DESCRIPTION OF A PREFERRED EMBODIMENT

The present invention provides a system and method for tuning gain and bandwidth of a CMOS receiver in response to sensed input data rate, temperature and power voltage. The receiver is provided with a default configuration, where the gain and bandwidth of the receiver are fixed for incoming data rate and signal amplitude meeting the design target specifications, in which case no tuning is necessary of the receiver. However, when conditions change such as a rise in chip temperature, many parameters may change. For example, thermal noise may increase, electron mobility may degrade, device parameters may drift and circuit performance may degrade, making adjustment of gain and/or bandwidth of the receiver to be necessary. For cases in which package parameters and transmission channel characteristic are different from original design assumptions, adjustment of receiver gain and/or bandwidth also become necessary.

Figure 1:
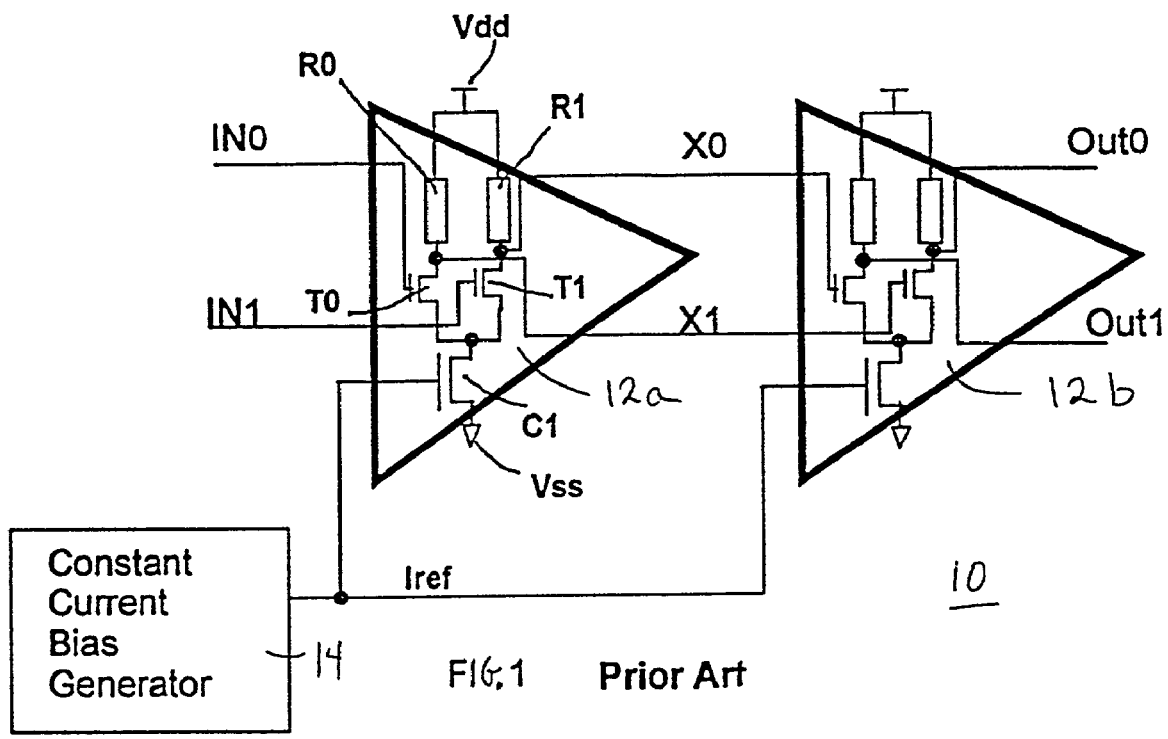
FIG. 1 is a circuit diagram of a prior art CMOS receiver.

FIG. 1 shows a conventional CMOS two stage CMOS receiver 10 having two stages 12a, 12b and a constant current bias generator 14. Each stage 12a, 12b includes a pair of input devices T0, T1, a tail device C1 connected at its drain to the sources of both of the input devices T0, T1 and a pair of load resistors R0, R1 connected at one end, respectively, to drains of input devices T0, T1, and at the other end to a power voltage Vdd. Input devices T0, T1 and tail device C1 are preferably nMOS devices. Preferably the load resistors R0, R1 are substantially the same, and the input devices T0, T1 are substantially the same. The constant current bias generator 14 applies a proper current bias Iref to the tail device C1 of stages 12a, 12b.

A pair of complementary incoming signals IN0, IN1 are received at the gates of input devices T0, T1, respectively, of the first stage 12a. Preferably the incoming signals IN0, IN1 are differential return to zero (RZ) formatted signals received from incoming signal pads. The incoming signals IN0, IN1 are amplified and inverted, output from the first stage 12a as signals X0, X1, respectively and provided as incoming signals to the second stage 12b. Signals X0, X1 are amplified and inverted by stage 12b, and output as signals Out0, Out1, respectively. The CMOS receiver 10 of FIG. 1 consumes a small amount of space and power relative to an equivalent BiCMOS receiver.

Figure 2:
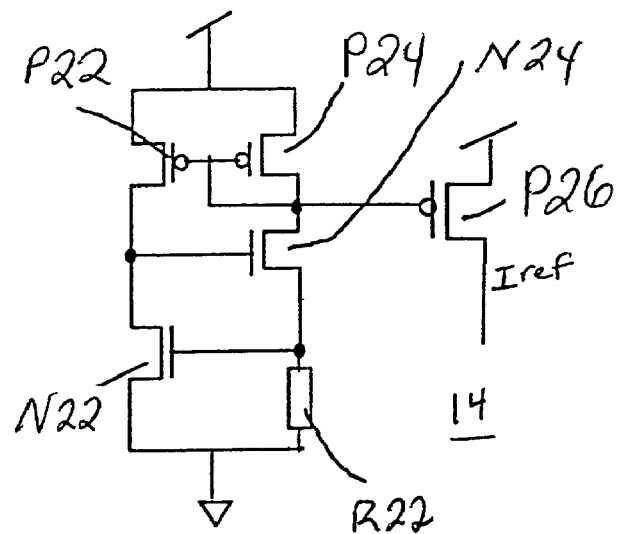
FIG. 2 is a circuit diagram of a prior art constant current bias generator.

FIG. 2 shows a prior art constant current bias generator 14, which is described in *Analysis and Design of Analog Integrated Circuits*, by Grey and Meyer, Wiley, $2^{nd}$ edition, 1990, pages 731-733. The constant current bias generator 14 includes three pMOS devices P22, P24, P26, and two nMOS devices N22, N24, and one resistor R22. The pMOS devices P22, P24, form a current mirror arrangement for forcing the same current to flow into the NMOS devices through drain sides. The current that flows through device N24 also flows through R22. For device N22 having a large width to length ratio, the generated bias current is established as $I=Vt/R$, where Vt is the threshold voltage of the device N22.

However, in this case, the current output Iref has a negative temperature coefficient due to Vt having a negative temperature coefficient and diffused resistors having a positive temperature coefficient. In other words, an increase in temperature would have a negative effect of reducing the Iref generated.

A suggested solution to the above problem is using a threshold difference bias generator that uses two devices having two different threshold voltages. The two devices operate in depletion mode and enhanced mode, respectively, and disadvantageously increase circuit area, power consumption and process costs for circuits that do not already use devices operating in different modes.

Another disadvantage of the constant current bias generator 14 of FIG. 2 is that its current bias is sensitive to the supply voltage. Supply voltage may suffer up to a +/−10% variation across a chip and between different chips depending on the layout of the chip(s), the distance between the receiver 10 and power supply pins, and packaging techniques. As supply voltage is reduced, Iref is reduced, affecting the performance of the receiver 10, and resulting in an increased bit error rate.

Figure 3:
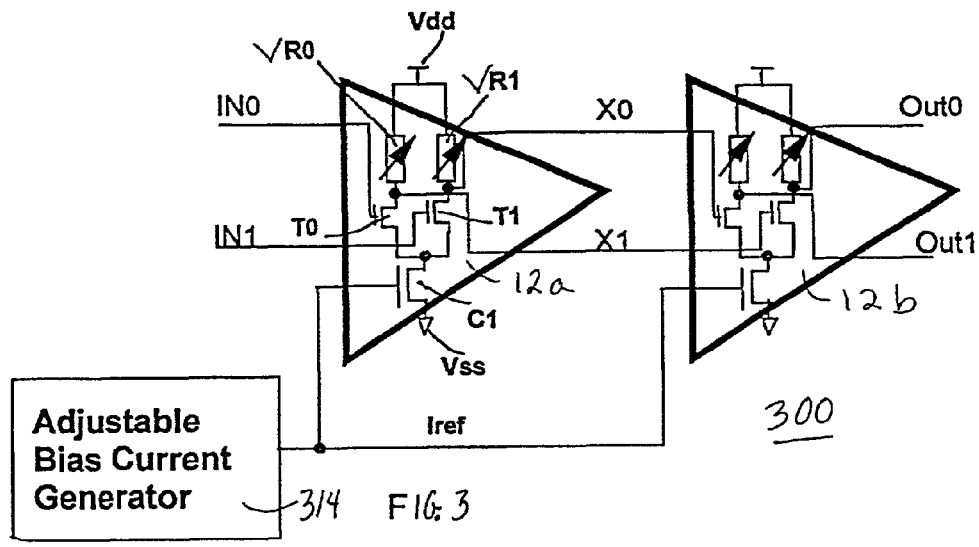
FIG. 3 is a circuit diagram of a tunable CMOS receiver in accordance with the present invention.

FIG. 3 shows a tunable CMOS receiver 300 using the same structure as CMOS receiver 10, except that the load resistors R0, R1 are replaced by variable resistors VR0, VR1, respectively, and the constant current bias generator 14 is replaced by an adjustable current bias generator 314. In other embodiments, only one of the load resistors R0, R1 or the constant current bias generator 14, or a combination thereof, are replaced. The tunable CMOS receiver 300 is tunable by adjusting at least one of the load resistors VR0, VR1 and the adjustable current bias generator 314.

Simulation experiments provide data shown in Tables 1 and 2 below. In the first simulation experiment the variable load resistors VR0, VR1 were varied for adjusting the load resistance of the tunable receiver 300. Results for the first simulation experiment are shown in Table 1. The results show that as the gain is increased, the bandwidth is decreased. For applications in which a very high bandwidth is not needed, the load resistance can be varied to provide a significant increase in gain for improving bit error rate of the tunable receiver 300. The load resistance can be adjusted to increase gain by approximately 4×, while bandwidth is reduced by approximately ½/×.

TABLE 1

|  | Resistor Size (L/W) | Gain (dB) | Bandwidth (GHz) |
| --- | --- | --- | --- |
| Case 1 | 6.75 µm/2.5 µm | 19.5 | 1.32 |
| Case 2 | 4.5 µm/2.25 µm | 14.5 | 1.88 |
| Case 3 | 2.25 µm/2.5 µm | 5.43 | 3.41 |

In the second simulation experiment the adjustable bias current generator 314 was tuned for adjusting the bias current Iref provided to the tail devices C1 of the tunable receiver 300. Results for the second simulation experiment are shown in Table 2. The results show that as the gain is increased, the bandwidth remained roughly unchanged. By increasing the bias current Iref by 4×, the gain of the tunable receiver 300 was increased from 5.43 dB to 8.75 dB.

TABLE 2

| | Device Size (um) | Gain (dB) | Bandwidth (GHz) |
|---|---|---|---|
| Case 4 | 6.5 | 8.75 | 3.42 |
| Case 5 | 13.5 | 8.09 | 3.43 |
| Case 6 | 27.0 | 5.43 | 3.41 |

Figure 4:
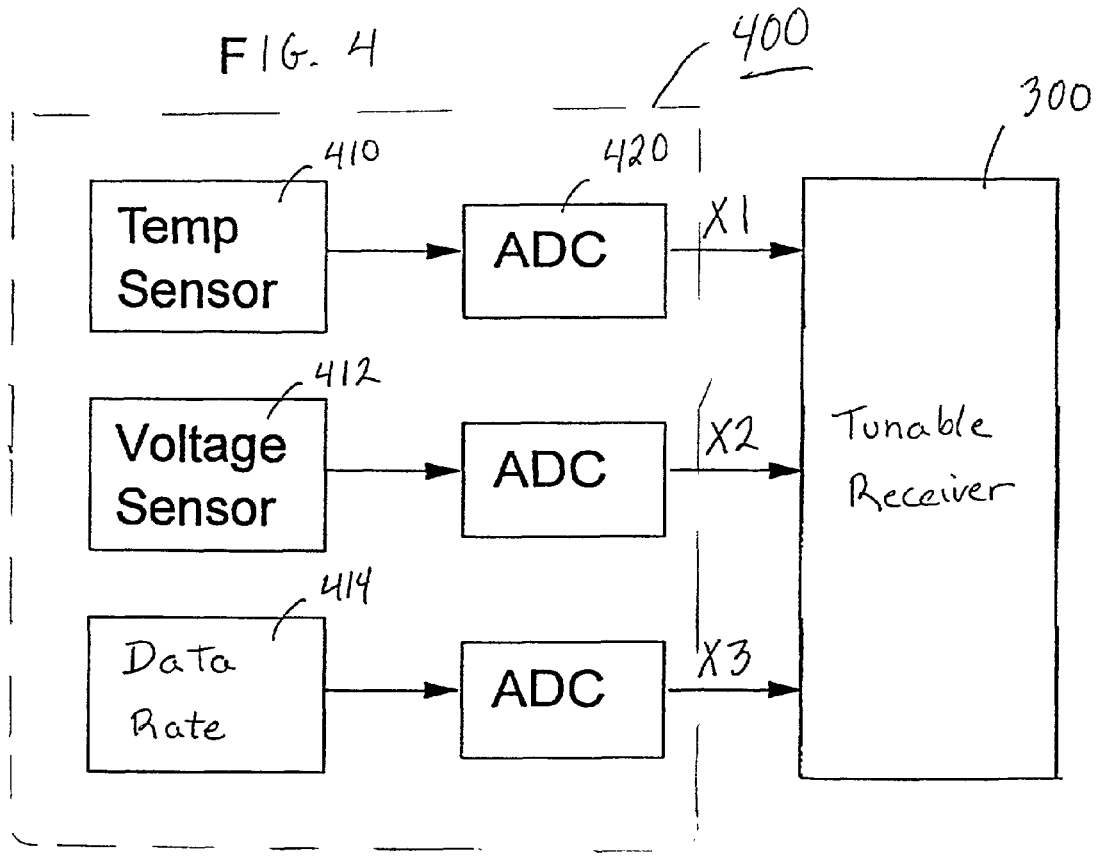
FIG. 4 is a block diagram of sensor control circuit of a tunable receiver in accordance with the present invention.

With reference to FIG. 4, a sense control circuit 400 is shown including a temperature sensor module 410, a voltage sensor module 412, a data rate sensor module 414, and an analog to digital converter (ADC) 420 connected to each of the sensor modules 410, 412, 414. Each ADC 420 converts the signal received from the associated sensor 410, 412 or 414 to a digital control signal X(1), X(2), X(3), respectively. The digital control signals X(1), X(2), X(3) are provided to the tunable receiver 300 for controlling the resistance of the load resistors VR0 and VR1 and/or the bias current Iref output by the adjustable bias current generator circuit. Sense control circuit 400 is provided internally or externally to the tunable receiver 300, or a combination thereof, for providing control signals X(1-3) to the tunable receiver 300.

The temperature sensor module 410 and the voltage sensor module 412 are conventional sensors that are known in the art. The temperature sensor module senses the chip temperature of the chip housing the tunable receiver 300. The voltage sensor module senses the supply voltage of the supplied to the tunable receiver 300. The data rate sensor module 414 senses a control voltage signal $V_{VCO}$ (see FIG. 5) corresponding to a voltage of a voltage controlled oscillator (VCO) generating a clock signal having a clock rate that matches the data rate of the incoming data, where the control voltage signal $V_{VCO}$ is indicative of the incoming data rate. The generation and sensing of the control voltage signal $V_{VCO}$ for generating control signal X(3) in accordance with the incoming data rate is described in greater detail below, with reference to FIG. 5.

The control signals received by the tunable receiver 300 may be processed by circuitry not shown for overriding digital control signals X(1-3) as desired and providing the control signals X(1-3) in accordance with sequence or a priority scheme to the appropriate control circuit or device. During testing and initialization and/or operation of the tunable receiver 300, the performance of the tunable receiver 300 is controlled by programming the load resistor, and/or the adjustable bias current generator 314 of the tunable receiver 300 using the control signals X(1-3) generated in accordance with the sensed incoming data rate, supply voltage and chip temperature.

Figure 5:
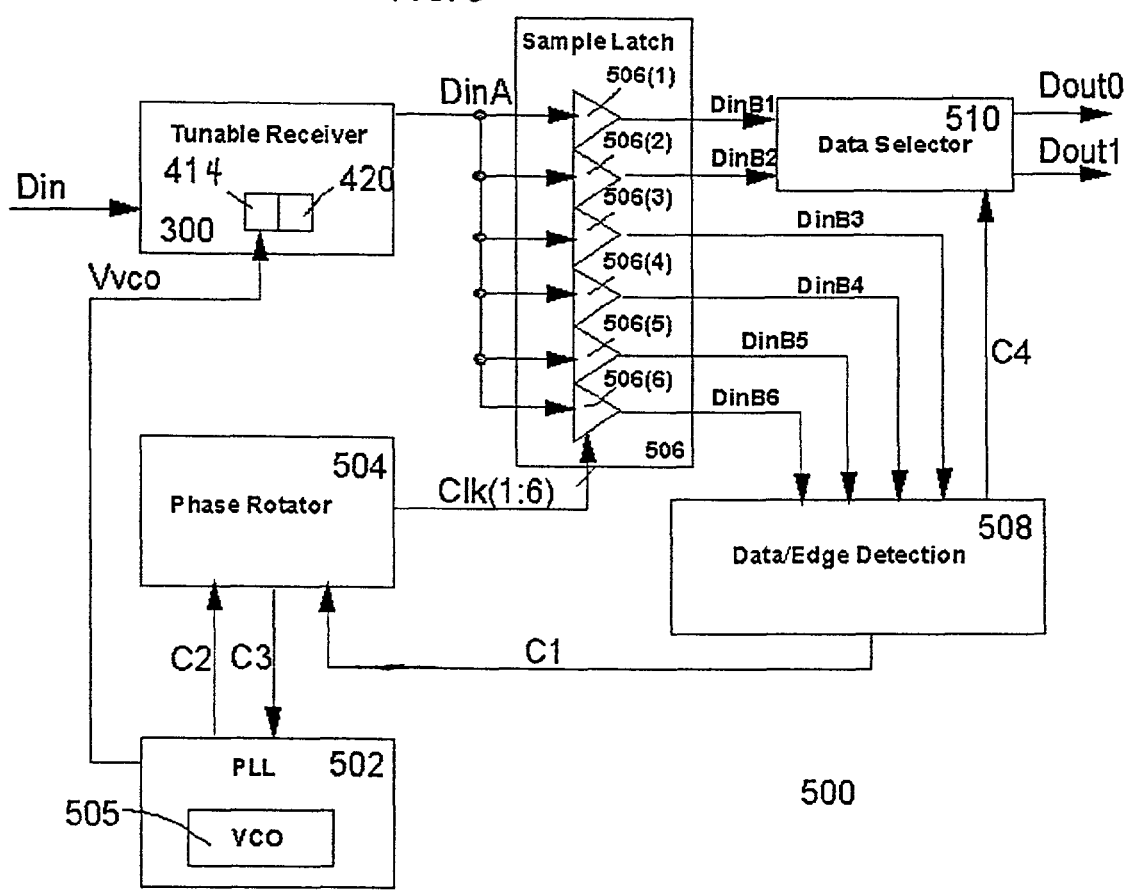
FIG. 5 is a block diagram of a CMOS of a receiver tuning system having a data rate sensing circuit in accordance with the present invention.

FIG. 5 shows the tunable receiver 300 receiving incoming data Din and control voltage signal $V_{VCO}$, and data rate establishment circuit 500 for establishing the data rate of the incoming data Din and generating $V_{VCO}$ accordingly. The data rate establishment 500 circuit includes phase lock loop circuit (PLL) 502, having a voltage controlled oscillator 505, phase rotator circuit 504, a sample latch circuit 506 having sample latches 506(n), where n=1-6 in this example, data/edge detection block 508 and a selector circuit 510.

To perform sample clock recovery for establishing the data rate of the incoming data, a stream of test data signals Din, preferably an RZ differential data pair, is received by the tunable receiver 300 before receiving the real data. The test data stream is processed by the tunable receiver 300 and output therefrom as DinA. DinA is processed by the sample latch circuit 506 and output therefrom as DinB1-DinB6. The sample latch circuit 506 latches DinA based on a clock signal generated by the phase rotator circuit 504 receiving an incoming clock C2 from phase lock loop circuit PLL 502. The sample latches 506(n) outputting DinB3-DinB6 perform pulse edge detection, and provide DinB3-DinB6 to the data/edge detection block 508 for determining whether pulse edges of DinB3-DinB6 are late or early for purposes of adjusting a rate of the clock signal C2 and therefore adjusting the rate of the clock signal Clk(1-6). DinB1 and DinB2 are provided to the selector circuit 510. Upon a determination that DinA is properly latched the selector unit 510 is controlled to output data pair Dout0, Dout1.

At the beginning, the PLL 502 generates a reference clock for incoming clock C2, which may have a different frequency from that of the incoming data Din. The reference clock generated by the PLL 502 is used to sample the incoming data Din within the sample latches 506(1-6) of the sample latch circuit 506.

The phase rotator circuit 504 receives the reference clock signal from PLL 502 and splits the reference clock signal into the predetermined number of (typically six) equally divided phases, which is output as Clk(n), where n=1-6 in this example. The Clk(1-6) signals, each having a different phase, are each sent to a respective sample latch 506(n) of the sample latch circuit 506 for data latching.

The data/edge detection block 508 uses a built-in algorithm to detect the signal edge of the data signals received. If the detected signal edge is "late" or "early" a control signal C1 is sent to the phase rotator circuit 504, which in turn adjusts the incoming clock phase/frequency by adjusting PLL 502 via control signal C3.

When the data DinB1-DinB6 is properly sensed and latched, the data/edge detection block 508 sends a control signal C4 to the selector circuit 510 to instruct the selector circuit 510 to latch outgoing data Dout in a shift register (not shown), at which point, the clock rate of clock C2 is identical with the data rate of the incoming data Din, and the clock phase of clock C2 is aligned with the phase of the incoming data.

The VCO inside the PLL is used to generate the clock C2, and the voltage level of the VCO is proportional to the data rate of clock C2. When C2 is adjusted to achieve correct sensing and latching, the voltage level of the VCO is further proportional to the data rate of the incoming data. The voltage control signal $V_{VCO}$ is generated having a voltage level equal to the voltage level of the VCO, and is provided to the tunable receiver 300.

The data rate sensor 414 and its associated ADC 420 (as shown in FIG. 4) are shown in this example to be built into the tunable receiver 300 for sensing the voltage level of the voltage control signal $V_{VCO}$ and converting the sensed voltage into digital control signal X(3) for receiver tuning. Alternatively, the data rate sensor 414 and associated ADC 420 may be located externally to the tuning receiver 300 for receiving the voltage control signal $V_{VCO}$ and providing control signal X(3) to the tunable receiver 300. For applications in which the data rate is not fixed, as the incoming data rate is determined, the sensed VCO voltage, which is proportional to the incoming data rate, is used to continually tune the receiver.

Adjusting the variable resistors VR0 and VR1 for tuning of the tunable receiver 300 may be implemented using a variable resistor circuit such as an exemplary first embodiment of a variable resistor circuit 600 shown in FIG. 6. The variable resistor circuit 600 includes a plurality of unit resistors R(m), where m=1–i, connected in series and a MOS switch 602. The unit resistors may have the same resistances or may have different resistances. The variable resistor circuit 600 receives a control signal X', decoded into bits X'(0–j), where X' is one of X(1), X(2) or X(3). The MOS switch 602 includes a plurality of MOS devices each receiving one of the respective decoded control signals X'(0–j), and where preferably j=i–2. The control signal X' controls bypassing of the unit resistors R(1–i), and controls the overall resistance of the variable resistor circuit 600 acting on a signal "s" passing through the variable resistor circuit 600. The MOS devices of MOS switch 602 are preferably small switch transistors for minimizing parasitic loading which could degrade the receiver performance.

Adjusting of the variable resistors VR0 and VR1 for tuning of the tunable receiver 300 may be implemented using a variable resistor circuit such as variable resistor circuit 700 shown in FIG. 7 and described in U.S. Pat. No. 5,864,416 mentioned above. The variable resistor circuit 700 includes a digital to analog converter (DAC) 702, an amplifier driver 704, a source follower device 706 and a resistive device R708. The DAC 702 receives an eight-bit control signal X', where X' is one of X(1), X(2) and X(3), and converts it into an analog voltage level that is fed into the amplifier driver 704. The amplifier driver 704 outputs a regulated voltage signal that is tied to the gate of the source follower device 706 for controlling a variable resistance associated with the amplifier driver 704. Resistor R708, is optionally included. The control signal X' controls the summed resistance of the variable resistor circuit 700 acting on a signal s passing through the variable resistor circuit 700.

Figure 8:
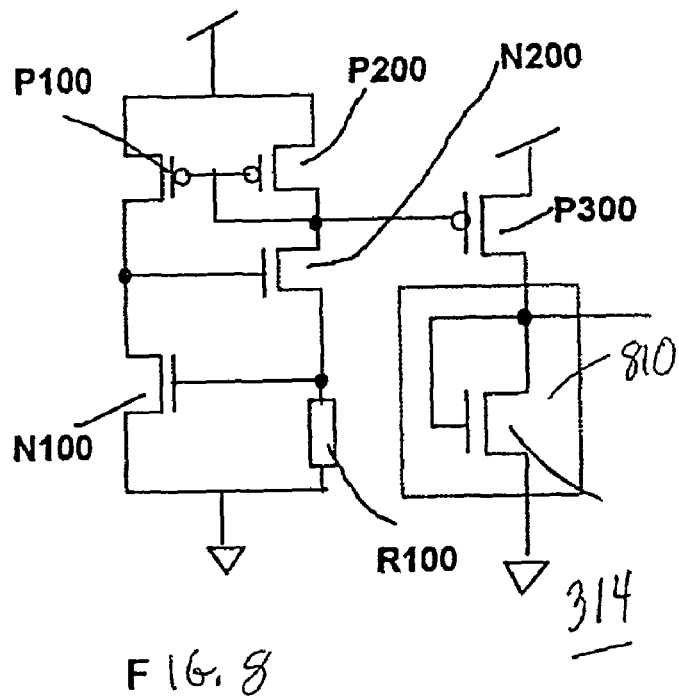
FIG. 8 is a circuit diagram of an adjustable bias current generator with a mirror control circuit in accordance with the present invention.

One embodiment of the adjustable bias current generator 314 for controlling the bias current Iref for tuning the tunable receiver 300 is shown in FIG. 8. The adjustable bias current generator 314 is similar to the prior art constant current bias generator 14, but differs by further including a variable mirror control circuit 810. The variable mirror control circuit 810 operates as an NMOS device having a programmable size. By programming the size of the nMOS device to control the size ratio of the NMOS device and the tail devices C1 of the tunable receiver 300, the bias current Iref of the tunable receiver 300 is proportionally mirrored, and the bias of the bias current Iref is controlled.

Figure 9:
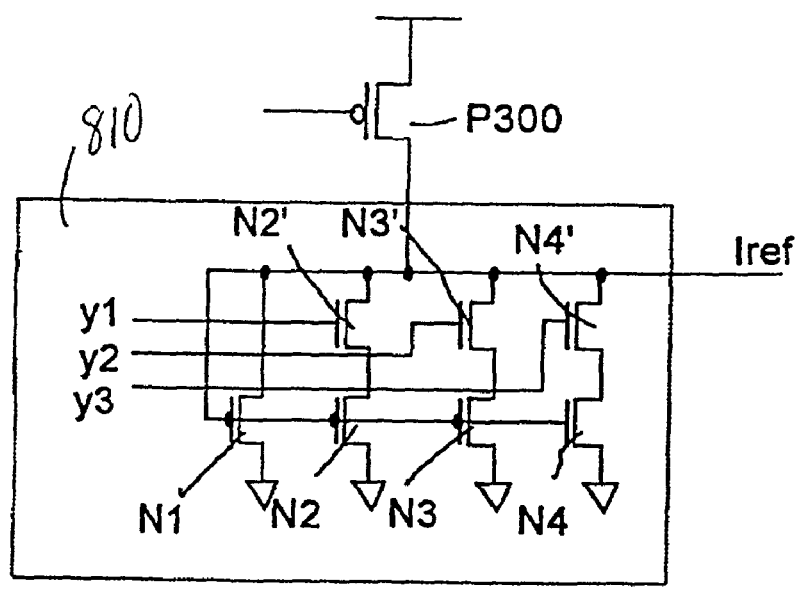
FIG. 9 is a circuit diagram of a mirror control circuit in accordance with the present invention.

FIG. 9 is an exemplary circuit diagram for the mirror control circuit 810 shown connected to pMOS device P300, and outputting the bias current Iref. The exemplary mirror control circuit 810 includes mirror devices N1-4 and switch devices N2'-4'. Preferably switch devices N2'-4' are nMOS devices, and mirror switch devices N1-N4 are nMOS devices, however switch devices N2'-4' may be selected to be n-type or p-type MOS devices in accordance with design choice, while preserving the function of the mirror control circuit 810 as described below.

A control signal X(1), X(2) or X(3), including control bits y1-y3, is provided to the tunable receiver 300. Control bits y1-y3 selectively control switching devices N2'-4' for selectively switching on or off each of the pull-down devices N2-4, and thus changing the size ratio of the mirror control circuit 810 acting as an nMOS device and the tail devices C1 of the tunable receiver 300 for selectively increasing or decreasing the bias current Iref and thus the gain of the tunable receiver 300.

Figure 10:
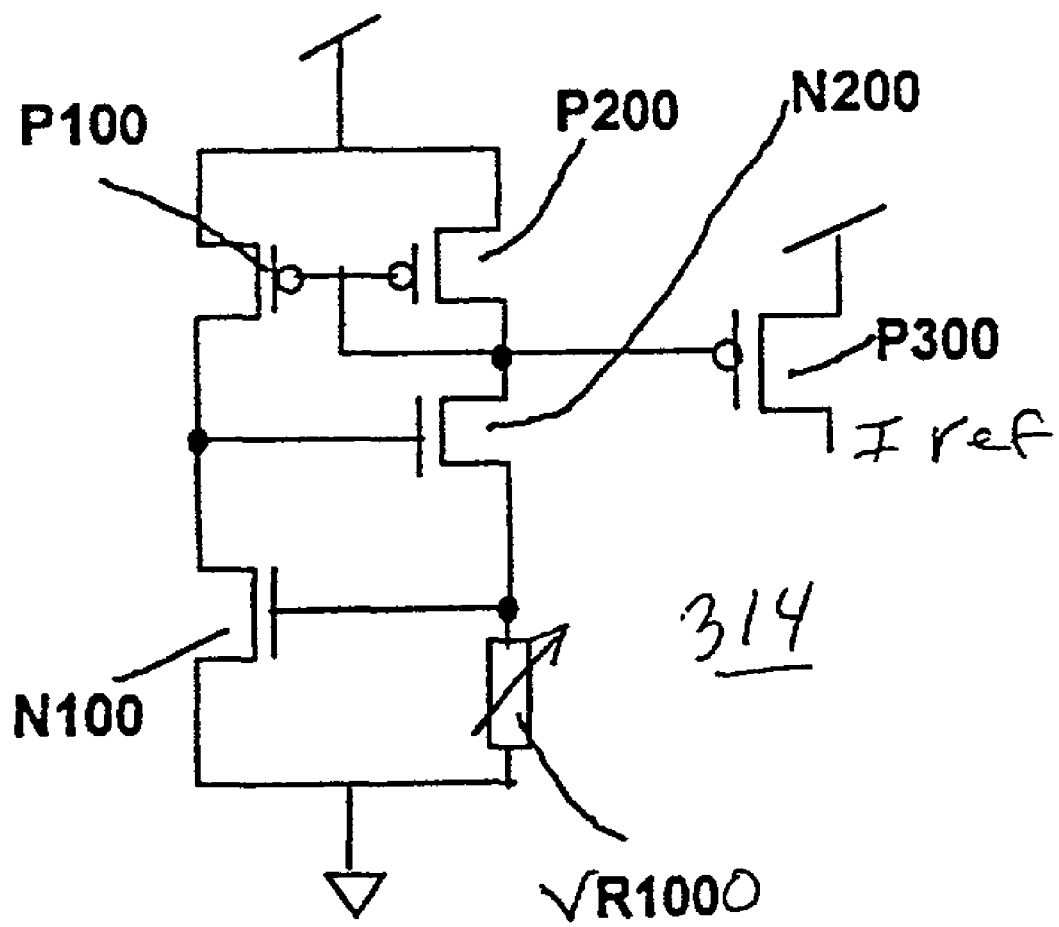
FIG. 10 is a circuit diagram of another embodiment of an adjustable bias current generator in accordance with the present invention.

Another embodiment of the adjustable current bias generator 314 is shown in FIG. 10, which is similar to the constant current bias generator 14, except that resistor R100 is substituted with a variable resistor VR1000. The variable resistor circuit 600 or the variable resistor circuit 700 may be used implement the variable resistor VR1000 for controlling the resistivity of VR1000 in accordance with one of control signals X(1-3) generated in accordance with sensed incoming data rate, temperature and supply voltage.

The tunable receiver 300 is tuned by controlling at least one of the load resistance of the tunable receiver 300, the resistance of the adjustable current bias generator 314 or the size of the mirror device of the adjustable current bias generator 314. Thus performance of the tunable receiver 300 is maintained, even for different data rates, chip temperatures and supply voltages.

What has been described herein is merely illustrative of the application of the principles of the present invention. For example, the systems described above and implemented as the best mode for operating the present invention are for illustration purposes only. As a particular example, for instance, other design configurations may be used for the variable resistor circuits, adjustable current bias generator, sense control circuit, receiver tuning system, and variable mirror control circuit which provide similar operation as the system described herein. The number of bits included in the control signals and the number of components controlled thereby may vary in accordance with design choice, and nMOS and pMOS devices may be substituted for one another where applicable while preserving similar operation as the system described herein. In other words, other arrangements and methods may be implemented by those skilled in the art and are contemplated to be within the scope of the appended claims.

The invention claimed is:

1. A CMOS receiver system having a tunable receiver having a tunable gain and bandwidth, the tunable receiver comprising:

means for receiving input signals;

a control circuit controlled by a control signal for tuning at least one of the gain and the bandwidth of the tunable receiver, said control circuit tuning the at least one of the gain and the bandwidth;

a voltage controlled oscillator (VCO) for generating a clock signal and having a voltage level proportional to a rate of the generated clock signal; and a clock control circuit for controlling the VCO to generate the clock signal at a rate substantially the same as the data rate of the input signals, wherein the control signal is indicative of a data rate of the input signals and has a voltage level proportional to the voltage level of the VCO.

2. The CMOS receiver system according to claim 1, wherein the control signal is further indicative of at least one of temperature associated with the tunable receiver and supply voltage associated with the tunable receiver.

3. The CMOS receiver system according to claim 1, wherein the input signals are complementary signals, and wherein the tunable receiver further comprises:

at least one stage including a pair of input MOSFET devices receiving respective complementary input signals, a tail MOSFET device connected to the pair of input MOSFET devices, and a pair of load resistors each connected to one of the pair of input MOSFET devices, respectively; and a bias current generator providing a bias current to a gate of the tail MOSFET device of the at least one stage.

4. The CMOS receiver system according to claim 3, wherein the control circuit includes a load resistor control circuit responsive to the control signal for controlling the resistivity of the pair of load resistors.

5. The CMOS receiver system according to claim 3, wherein the control circuit includes a bias current control circuit responsive to the control signal for controlling the bias of the bias current.

6. The CMOS receiver system according to claim 5, wherein the bias current generator includes a resistor and the bias current control circuit includes a resistor control circuit responsive to the control signal for controlling the resistivity of at least one of the load resistors.

7. The CMOS receiver system according to claim 5, wherein the bias current generator circuit includes a mirror circuit for processing the bias current, the mirror circuit having first and second mirror portions, and wherein the bias control circuit includes a means for controlling the ratio of the sizes of the first and second mirror portions.

8. The CMOS receiver system of claim 6, wherein the resistor control circuit includes a plurality of resistors and a plurality of switch devices, wherein each switch device of the plurality of switch devices controls bypassing of one or more resistors of the plurality of resistors, and wherein the control signal controls each of the switch devices for controlling the resistivity of the resistor control circuit.

9. The CMOS receiver system of claim 6, wherein the control signal is a digital control signal and the resistor control circuit includes:
a digital to analog converter (DAC) receiving the control signal and converting the control signal into an analog voltage level;
an amplifier driver receiving the analog voltage level and outputting a control voltage signal regulated by the control signal;
a source follower device having a gate, source and drain, wherein the control voltage signal is provided to the source follower device at its gate for controlling resistance along a source drain path of the source follower device.

10. The CMOS receiver system according to claim 1, wherein the control signal is generated upon the initialization of the tunable receiver, and the control signal is further indicative of a voltage control signal.

11. The CMOS receiver system according to claim 1, wherein the CMOS receiver is a non-transimpedance receiver.

12. The CMOS receiver system according to claim 11, wherein the VCO is included in a phase lock loop circuit (PLL) and the clock control circuit includes:
phase rotator means for receiving and shifting the clock signal and generating a plurality of shifted clock signals;
sampling, latching and detecting pulse edges means for receiving the input signals from the tunable receiver, receiving the plurality of shifted clock signals, sampling and latching the received data in accordance with the plurality of shifted clock signals, detecting pulse edges of the sampled and latched input signals, determining a late/early status relative to the clock signal of the detected pulse, and generating a late/early status control signal in accordance with the determined late/early status; and providing the late/early status control signal to the phase rotator means, wherein the phase rotator means controls the PLL in accordance with the late/early control signal for adjusting the voltage level of the VCO for adjusting the rate of the clock signal;
voltage sensing means for sensing the voltage level of the VCO; and
conversion means for converting the sensed voltage level into the control signal.

13. A method for tuning a CMOS receiver input signals comprising the steps of:
receiving at least one control signal;
controlling one of gain and bandwidth of the CMOS receiver in accordance with the at least one control signal; and
generating a clock signal in a voltage controlled oscillator (VCO), the VCO having a voltage level proportional to a clock rate of the clock signal; and
controlling the VCO to generate the clock signal to have a clock rate substantially the same as the data rate of received input signals,
wherein the at least one control signal is indicative of a data rate of the received input signals and has a voltage level proportional to the voltage level of the VCO.

14. The method according to claim 13, wherein the at least one control signal is further indicative of at least one of temperature associated with the CMOS receiver and supply voltage associated with the CMOS receiver.

15. The method according to claim 13, further comprising the step of controlling resistivity of a load resistor of the CMOS receiver in accordance with the at least one control signal.

16. The method according to claim 13, further comprising the step of controlling resistivity of a bias control circuit in accordance with the at least one control signal for controlling a bias current provided to a tail device of at least one stage of the CMOS receiver.

17. The method according to claim 16, further comprising the step of controlling the size of a first portion of first and second portions of a mirror circuit processing the bias current in accordance with the at least one control signal for controlling a ratio of the sizes of the first and second portions.

18. The method according to claim 13,
wherein the CMOS receiver is a non-transimpedance receiver.

19. The method according to claim 13, further including the steps of:
receiving and shifting the clock signal;
generating a plurality of shifted clock signals;
sampling the input signals;
latching the sampled input signal;
detecting pulse edges of the sampled and latched input signals;
determining a late/early status of the detected pulse edges relative to the clock signal;
sensing the VCO voltage level; and
converting the sensed VCO voltage level into the at least one control signal;
wherein the controlling the VCO step includes controlling the VCO in accordance with the late/early status.

20. A CMOS receiver receiving input signals having a tunable gain and a bandwidth comprising:
means for receiving at least one control signal; and
means for controlling, in the absence of a resistive feedback loop, one of the gain and the bandwidth of the CMOS receiver in accordance with the at least one control signal;
means for generating a clock signal in a voltage controlled oscillator (VCO), the VCO having a voltage level proportional to a clock rate of the clock signal; and
means for controlling the VCO to generate the clock signal to have a clock rate substantially the same as the data rate of the input signals,
wherein the at least one control signal is indicative of a data rate of the input signals and has a voltage level proportional to the voltage level of the VCO.

21. The CMOS receiver according to claim 20, wherein the control signal is indicative of at least one of temperature associated with the CMOS receiver, supply voltage associated with the CMOS receiver, data rate of at least one input signal received by the CMOS receiver, and amplitude of the at least one input signal received by the CMOS receiver.

22. The CMOS receiver according to claim 20, further comprising:
  at least one stage including a pair of input MOSFET devices receiving respective complementary input signals, a tail MOSFET device connected to the pair of input MOSFET devices, and a pair of load resistors each connected to one of the pair of input devices, respectively; and
  a bias current generator providing a bias current to a gate of the tail device of the at least one stage.

23. The CMOS receiver according to claim 22, further comprising means for controlling resistivity of the load resistor of the CMOS receiver in accordance with the at lease one control signal.

24. The CMOS receiver according to claim 22, further comprising means for controlling resistivity of the bias current generator in accordance with the at least one control signal for controlling the bias current provided to the tail device of the at least one stage of the CMOS receiver.

25. The CMOS receiver according to claim 22, further comprising means for controlling the size of a first portion of first and second portions of a mirror circuit of the bias current generator processing the bias current in accordance with the at least one control signal for controlling a ratio of the sizes of the first and second portions.

* * * * *